United States Patent [19]

Ogawa

[11] Patent Number: 4,799,198
[45] Date of Patent: Jan. 17, 1989

[54] IMAGE MEMORY

[75] Inventor: Junji Ogawa, Tokyo, Japan

[73] Assignee: Fujitsu Limited, Kanagawa, Japan

[21] Appl. No.: 850,790

[22] Filed: Apr. 11, 1986

[30] Foreign Application Priority Data

Apr. 13, 1985 [JP] Japan .................................. 60-77545

[51] Int. Cl.$^4$ ............................................. G11C 7/00
[52] U.S. Cl. .................................... 365/221; 340/800
[58] Field of Search ................. 365/219, 220, 221, 80, 365/81, 83; 377/67; 340/800

[56] References Cited

U.S. PATENT DOCUMENTS 3,787,817  1/1974  Goldberg ........................... 365/219
4,633,441  12/1986  Ishimoto ............................. 365/219

OTHER PUBLICATIONS

IEEE, International Solid-State Circuits Conference (ISSCC 85), Digest of Technical Papers, Feb. 13, 1985, pp. 38 and 39.

Primary Examiner—James W. Moffitt
Attorney, Agent, or Firm—Armstrong, Nikaido, Marmelstein & Kubovcik

[57] ABSTRACT

A video random access memory (Video RAM) having a plurality of RAM and shift register sets, the RAM being randomly accessed and the shift register being serially accessed, each RAM and shift register being connected by transfer gates in order to transfer read/write data. The Video RAM comprising; an input/output circuit operatively connected to the shift register and switched from an input side to an output side or from an output side to an input side in response to a direction of data transfer between the RAM and the shift register, and a transfer control circuit for controlling the switching of the input/output circuit and the controlling the direction of data transfer based on predetermined modes of the input signals.

10 Claims, 18 Drawing Sheets

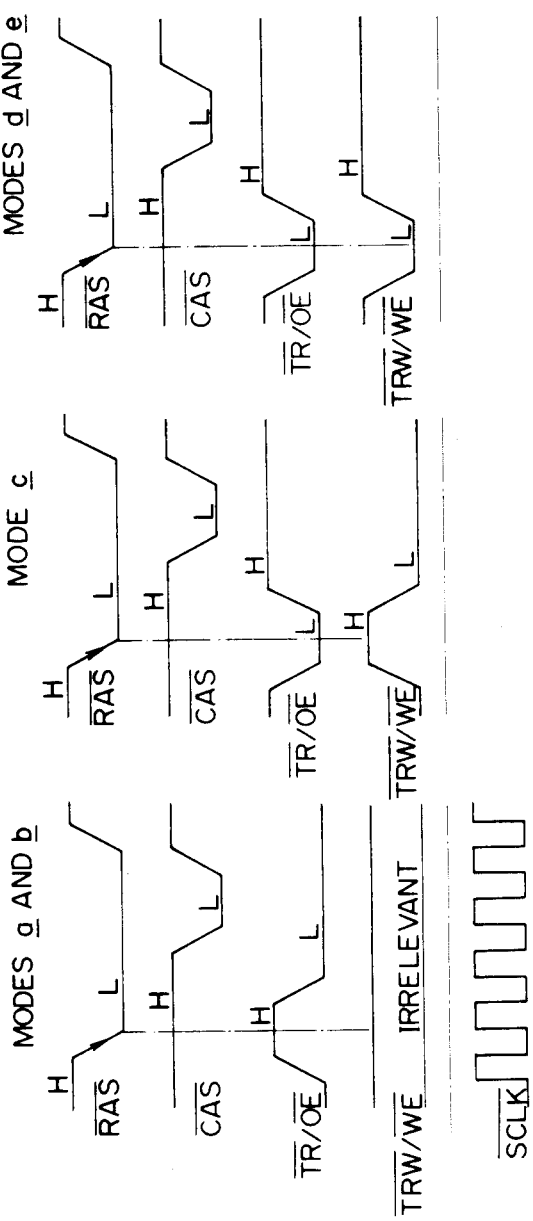

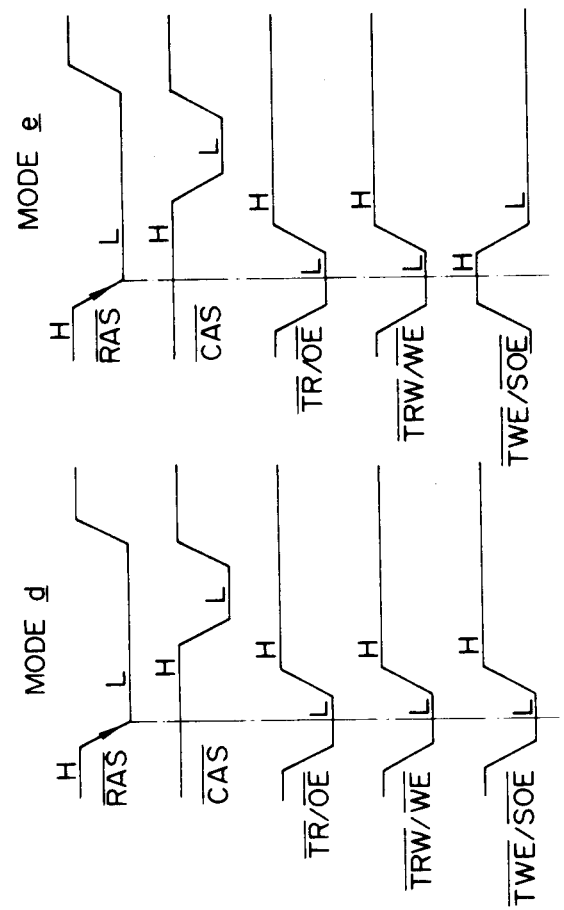

Fig. 15

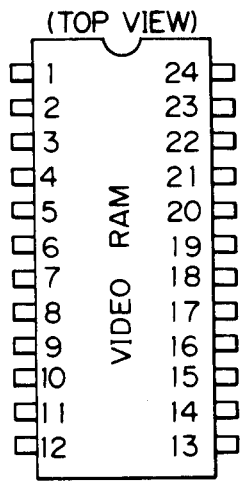

(TOP VIEW)

VIDEO RAM

Fig. 15A

| NUMBER | SYMBOL | TERMINAL NAME | MODE |
|---|---|---|---|
| 1 | $\overline{SCLK}$ | SHIFT CLOCK | INPUT |
| 2,3,22,23 | $SD_0 \sim SD_3$ | SERIAL DATA INPUT/OUTPUT | IN/OUT |
| 4 | $\overline{TR/OE}$ | TRANSFER/OUT ENABLE | INPUT |
| 5,6,19,20 | $DQ_0 \sim DQ_3$ | DATA IN/OUT | IN/OUT |
| 7 | $\overline{TRW/WE}$ | TRANSFER READ WRITE /WRITE ENABLE | INPUT |
| 8 | $\overline{RAS}$ | ROW ADDRESS STROBE | INPUT |
| 9,10,11,13 14,15,16,17 | $A_0 \sim A_7$ | ADDRESS INPUT | INPUT |
| 12 | Vcc | POWER SOURCE (+5V) | — |
| 18 | $\overline{CAS}$ | COLUMN ADDRESS STROBE | INPUT |
| 21 | $\overline{TWE/SOE}$ | TRANSFER WRITE ENABLE /SERIAL OUTPUT ENABLE | INPUT |
| 24 | Vss | GROUND | — |

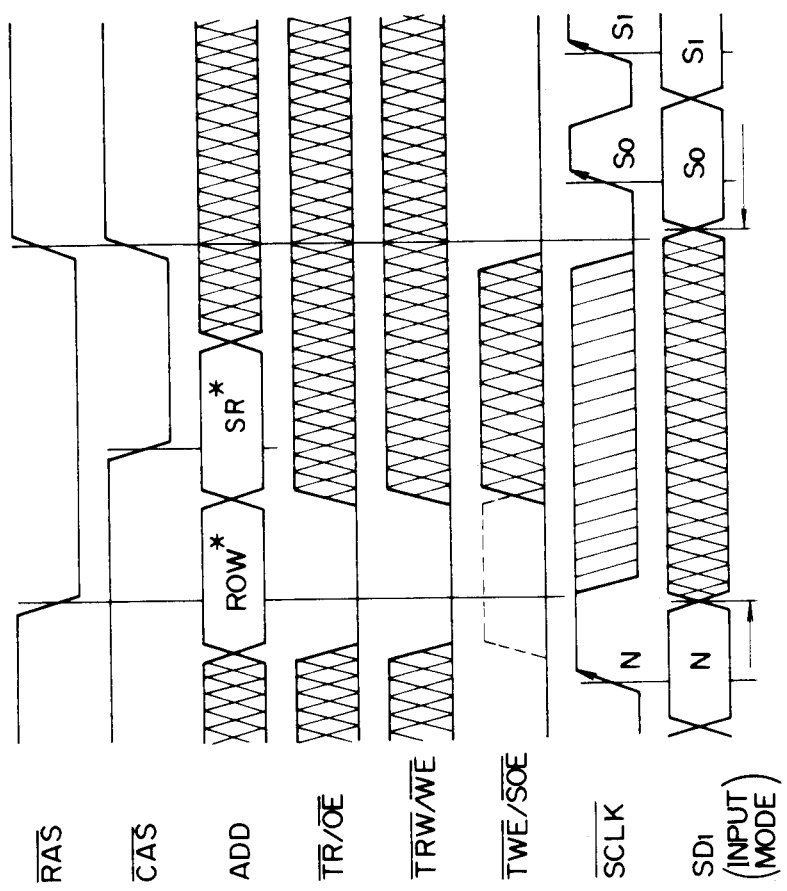

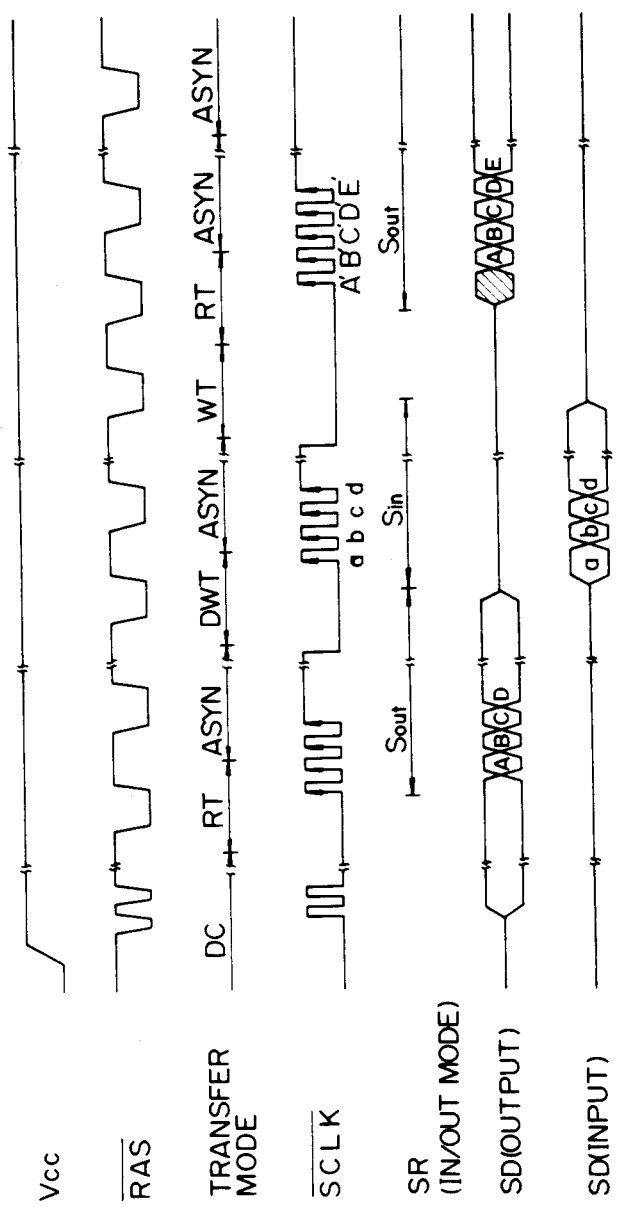

IMAGE MEMORY

BACKGROUND OF THE INVENTION

1. Field of the Invention

The present invention relates to a semiconductor memory, more particularly to a video random access memory (Video RAM) by a large scale integrated circuit (LSI) used as the image memory.

The Video RAM according to the present invention is advantageously used for high speed serial read/write data transfer in an information processing system.

2. Description of the Related Art

Recently, the display apparatus, particularly a graphic display apparatus, has been considerably developed in the field of information processing systems. The Video RAM used in this graphic display apparatus is generally constituted by a plurality of RAM (for example, dynamic RAM's) and shift register sets. The RAM is used for storing the image data and is randomly accessed by a memory controller. The shift register is serially accessed and used for reading/writing the data from/to the RAM. Accordingly, one of the functions required of the Video RAM is a high speed read/write operation. Another requirement is to miniaturize a structure thereof, and thus increase the packaging density of memory cell array. The Video RAM has many external pins (terminals), for example, 24 pins, in order to connect with another device, but the number of terminal that can be provided is limited due to the above-mentioned miniaturization and package densifying. Therefore, many functions are required for each terminal, for example, as a data or signal input/output terminal. In general, many input terminals and output terminals are used only for one purpose in the Video RAM. However, if the input terminal can be used in common with the output terminal, the number of pins having the input/output function can be reduced by half in the Video RAM. Accordingly, the remaining terminals can be used for other purposes, so that the Video RAM can have many other functions necessary to the graphic display.

Three relevant conventional Video RAM's are disclosed in the NIKKEI ELECTRONICS, 1985, May 20 and Aug. 12, and IEEE, International Solid-State Circuit Conference (ISSCC 85), Digest of Technical Papers, Feb. 13, 1985 pages 30 and 39.

SUMMARY OF THE INVENTION

The primary object of the present invention is to provide a semiconductor memory used as a Video RAM enabling high speed serial read/write data transfer.

Another object of the present invention is to provide a Video RAM enabling a switching of the input/output of a terminal by using various transfer modes, thereby obtaining various functions without increasing the number of pins.

Still another object of the present invention is to provide a Video RAM having dual ports for random accessing and for serial accessing.

In accordance with the present invention, there is provided a Video RAM having a plurality of RAM and shift register sets, the RAM being randomly accessed and the shift register being serially accessed, each RAM and shift register being connected by transfer gates in order to transfer read/write data. The Video RAM comprises: an input/output circuit operatively connected to the shift register and switched from an input side to an output side or from an output side to an input side in response to the direction of data transfer between the RAM and the shift register, and a transfer control circuit for controlling the switching of the input/output circuit and for controlling the direction of data transfer based on predetermined modes of input signals.

BRIEF DESCRIPTION OF THE DRAWINGS

In the drawings:

FIGS. 4A to 4C are basic mode patterns according to an embodiment of the present invention;

FIGS. 5A and 5B are basic mode patterns according to another embodiment of the present invention;

FIG. 15 is a top view for explaining a terminal arrangement of the Video RAM according to the present invention;

FIG. 15A is a table showing the pin descriptions of the Video RAM of FIG. 15;

FIGS. 16 to 18 are actual timing charts of the best mode of operation according to the present invention; and, FIG. 19 is timing chart of a combination of the various modes shown in FIGS. 16 to 18.

DESCRIPTION OF THE PREFERRED EMBODIMENTS

Before describing the preferred embodiments, an explanation will be given of a conventional Video RAM.

Figure 1:
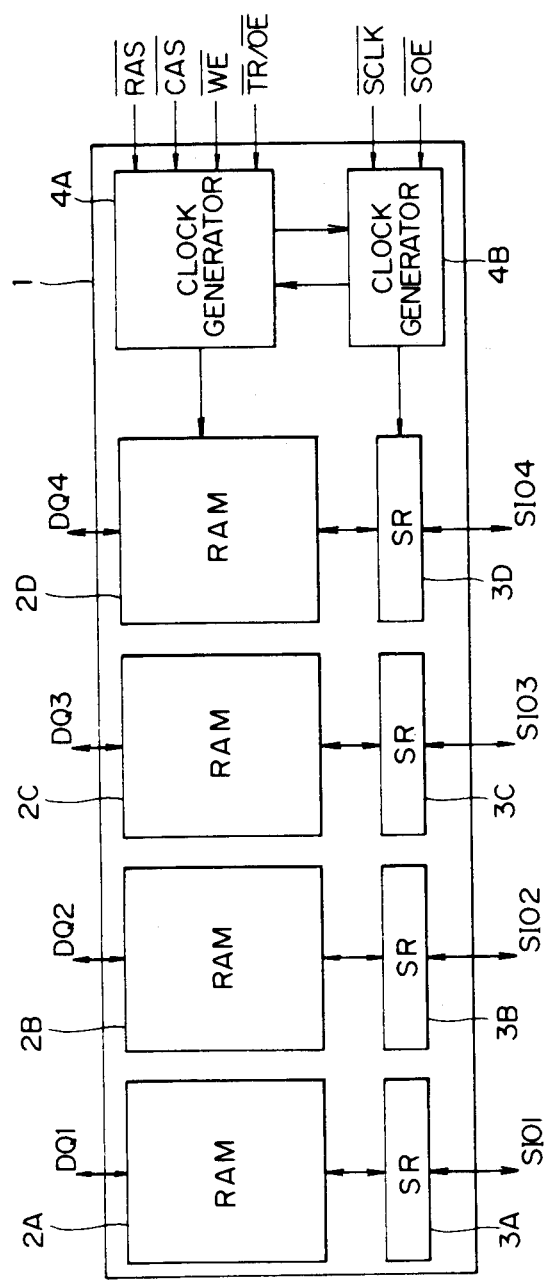
FIG. 1 is a schematic block diagram of a conventional Video RAM.

Referring to FIG. 1, reference numeral 1 represents a Video RAM chip, 2A to 2D RAM's, 3A to 3D shift registers (SR's), 4A and 4B clock generators, SI01 to SI04 input/output terminals for the SR's 3A to 3D, DQ1 to DQ4 input/output terminals for the RAM's 2A to 2D, $\overline{RAS}$ a row address strobe terminal, $\overline{CAS}$ a column address strobe terminal, $\overline{WE}$ a write enable terminal, $\overline{TR/OE}$ a transfer command/output enable terminal, $\overline{SCLK}$ a serial clock signal terminal, and $\overline{SOE}$ a serial output enable terminal.

In the Video RAM, terminals SI01 to SI04 are used as input/output terminals of the shift registers 3A to 3D for serially accessing the data. Other terminals DQ1 to DQ4 are used as input/output terminals of the RAM's 2A to 2D for randomly accessing the stored data. As explained above, it is possible to greatly reduce the number of pins when some terminals are used as common input/output terminals.

There are, however, some problems regarding the switching of the input/output mode of these terminals. Conventionally, the terminal $\overline{\text{SOE}}$ is also used as the terminal for switching the input/output mode. However, it is undesirable to use this terminal in common as the I/O switching terminal because there are large differences of "output data rate" between the RAM and the shift register.

A Video RAM according to the present invention will be explained in detail hereinafter. In the present invention, each terminal of the shift register is used as the input/output terminal, and it is possible to easily switch the input/output mode without using the terminal $\overline{\text{SOE}}$ as the input/output switching terminal and without newly adding another input/output terminal. A transfer control mode is utilized for switching the input/output mode in the present invention.

Figure 2:
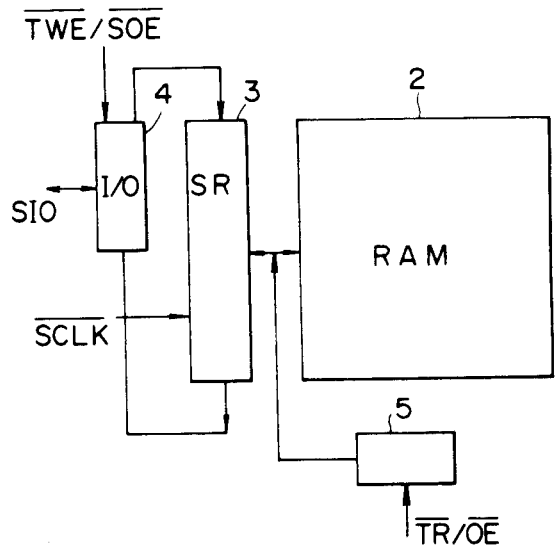
FIG. 2 is a basic block diagram for explaining a principle of the present invention.

Referring to FIG. 2, this basic block diagram shows a RAM and SR set, for example, a set consisting of the RAM 2A and the shift register 3A in FIG. 1. Accordingly, reference numeral 2 represent a RAM, 3 a shift register (SR), 4 an input/output (I/O) circuit, 5 a transfer command circuit, and SIO an input/output terminal. The serial clock signal is input to the SR 3 through the $\overline{\text{SCLK}}$. The transfer write enable/serial output enable signal is input to the I/O circuit 4 through the $\overline{\text{TWE/SOE}}$. Moreover, the transfer/output enable signal is also input to the transfer command circuit 4 through the $\overline{\text{TR/OE}}$.

The basic operation of serial read/write data transfer is as follows. That is, when the terminal SIO functions as the input terminal, the data is written in the RAM through the I/O circuit 4 and the SR 3 in response to the clock signal $\overline{\text{SCLK}}$. In this case, the transfer signal $\overline{\text{TR}}$ is used for opening the gate transistor provided between the RAM and the SR. When the terminal SIO functions as the output terminal, the stored data is read from the RAM through the SR 3 and the I/O circuit 4. These operations will be explained in detail below.

Figure 3A:
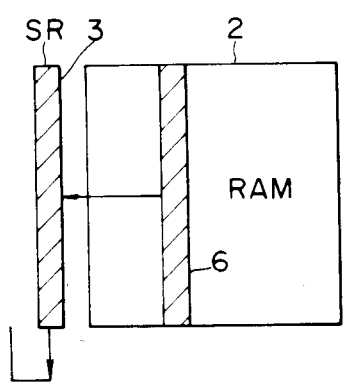
FIGS. 3A and 3B are basic block diagrams for explaining a basic operation of the present invention.
Figure 3B:
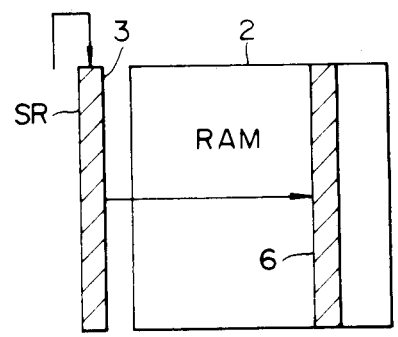

Referring to FIGS. 3A and 3B, reference numeral 6 represents the data for one line, i.e., the data for one page on the word line in the RAM 2. The read operation is explained by using FIG. 3A and the write operation by using FIG. 3B. In the read operation, the data 6 is simultaneously read out i parallel to the shift register 3 in response to the transfer signal $\overline{\text{TR}}$. When the transfer from the RAM to the SR is finished, the I/O circuit 4 is switched to the output side and the terminal SIO is switched to the output side. Then, data stored in the shift register 3 is serially read out from the terminal SIO.

In the write operation, the I/O circuit 4 is switched to the input side before the transfer signal $\overline{\text{TR}}$ is input to the transfer gate. When the data is serially input to the shift register 3 through the input terminal SIO and fully stored in the shift register 3, the data is transferred and written in parallel in the RAM as the data for one line based on the transfer signal $\overline{\text{TR}}$.

As explained above, the switching of the I/O circuit 4 is performed in correspondence with the transfer and reading of the data from the RAM 2 to the SR 3, or in correspondence with the transfer and writing of the data from the SR 3 to the RAM 2. In these cases, it is necessary for the I/O circuit 4 to be switched from the input to the output after the data is transferred from the RAM 2 to the SR 3 in the read operation, while it is necessary for the I/O circuit 4 to be switched from the output to the input before the data is transferred from the SR 3 to the RAM 2. Regarding the above-mentioned switch, there is sufficient time for switching the I/O circuit 4 between these transfers of the data because the output data rate of the RAM is larger than that of the SR (i.e., the data output speed of the RAM is slower than that of the SR). Accordingly, since the operation of the SR is stopped from after the data transfer until the next transfer, the I/O circuit 4 can be switched during this interval.

The principle of the present invention is based on the fact that the input/output mode of the I/O circuit 4 statistically depends on the data transfer direction between the RAM and the SR. That is, when the data is transferred from the RAM to the SR, the data is read out from the SR to the I/O circuit. Accordingly, the terminal SIO becomes an output side. While, when the data is transferred from the SR to the RAM, the data is written to the SR through the I/O circuit. In this case, the terminal SIO becomes an input side. As explained above, there is the sufficient time for switching the I/O circuit between the input and output.

Consequently, various basic modes indicating the data transfer direction are set in order to switch the I/O circuit, and then the terminal SIO is switched based on the predetermined mode. These modes will be explained in detail hereinafter.

Referring to FIGS. 4A to 4C, FIG. 4A shows modes a and b, FIG. 4B mode c, and FIG. 4C modes d and e. The terminal $\overline{\text{RAS}}$ is used for inputting a row address strobe signal, and the $\overline{\text{CAS}}$ for inputting a column address strobe signal. The terminal $\overline{\text{TR/OE}}$ is used for inputting a data transfer signal and an output enable signal for reading, the terminal $\overline{\text{TRW/WE}}$ (see FIGS. 6 and 7) for inputting a transfer read/write signal and a write enable signal. Thus, it is possible to obtain various modes by combining these modes.

1. mode a

The mode a shows an asynchronous operation between the RAM and the SR. The SR 3 is set to an output mode.

2. mode b

The mode b also shows an asynchronous operation between the RAM and the SR. The SR 3 is set to an input mode.

3. mode c

The mode c shows a read transfer operation is parallel from the RAM 2 to the SR 3. The terminal SIO is switched to the output side.

4. mode d

The mode d shows a write transfer operation in parallel, from the SR 3 to the RAM 2. The terminal SIO is switched to the input side.

5. mode e

The mode e shows a non-transfer mode and functions only when the terminal SIO switches to the input side.

In modes a and b, the asynchronous operation means that the RAM and the SR separate independently from each other, based on the random access. The $\overline{\text{RAS}}$ and the $\overline{\text{CAS}}$ patterns are the same throughout FIGS. 4A to 4C.

In FIG. 4A, when the $\overline{\text{RAS}}$ is switched from "H" level to "L" level, as shown by a trailing edge arrow, the $\overline{\text{CAS}}$ is "H" level and $\overline{\text{TR/OE}}$ is also "H" level at the time showing a chain dotted line. The terminal $\overline{\text{TRW/WE}}$ is irrelevant to the read/write transfer because the RAM and the SR operate independently and asynchronously from each other. In this case, the distinction between mode a and mode b depends on the previous mode. That is, either mode a or mode b is determined by whether the previous mode is mode c or mode d.

In FIG. 4B, the $\overline{TR/OE}$ is "L" level and the $\overline{TRW/WE}$ is "H" level. The "L" level of the $\overline{TR/OE}$ means a synchronous transfer and the "H" level of the $\overline{TRW/WE}$ means a read transfer.

In FIG. 4C, the $\overline{TR/OE}$ is also "L" level but the $\overline{TRW/WE}$ is "L" level. The "L" level of the $\overline{TRW/WE}$ means a write transfer. In this case, the distinction between mode d and mode e also depends on the previous mode. That is, for example, when the previous mode is c, the mode e is selected. When the previous mode is either e or d, the mode d is selected.

Referring to FIGS. 5A and 5B, FIG. 5A shows mode d and FIG. 5B shows mode e. As explained above, the same patterns as in FIGS. 4B and 4C are provided to the $\overline{RAS}$, $\overline{CAS}$ and $\overline{TR/OE}$ patterns. $\overline{TWE/SOE}$ is "L" level when mode d but "H" level when mode e at the time shown by a chain dotted line. The terminal $\overline{TWE/SOE}$ is used as a transfer write enable and serial output enable terminal.

In this case, the non-transfer mode as shown by mode e is always necessary for data transfer. As mentioned above, the mode e is used only for switching the terminal SIO to the input side. This mode e is inserted between the read transfer mode and the write transfer mode in order to prevent an error such as the read data is used again as the write data.

Figure 6:
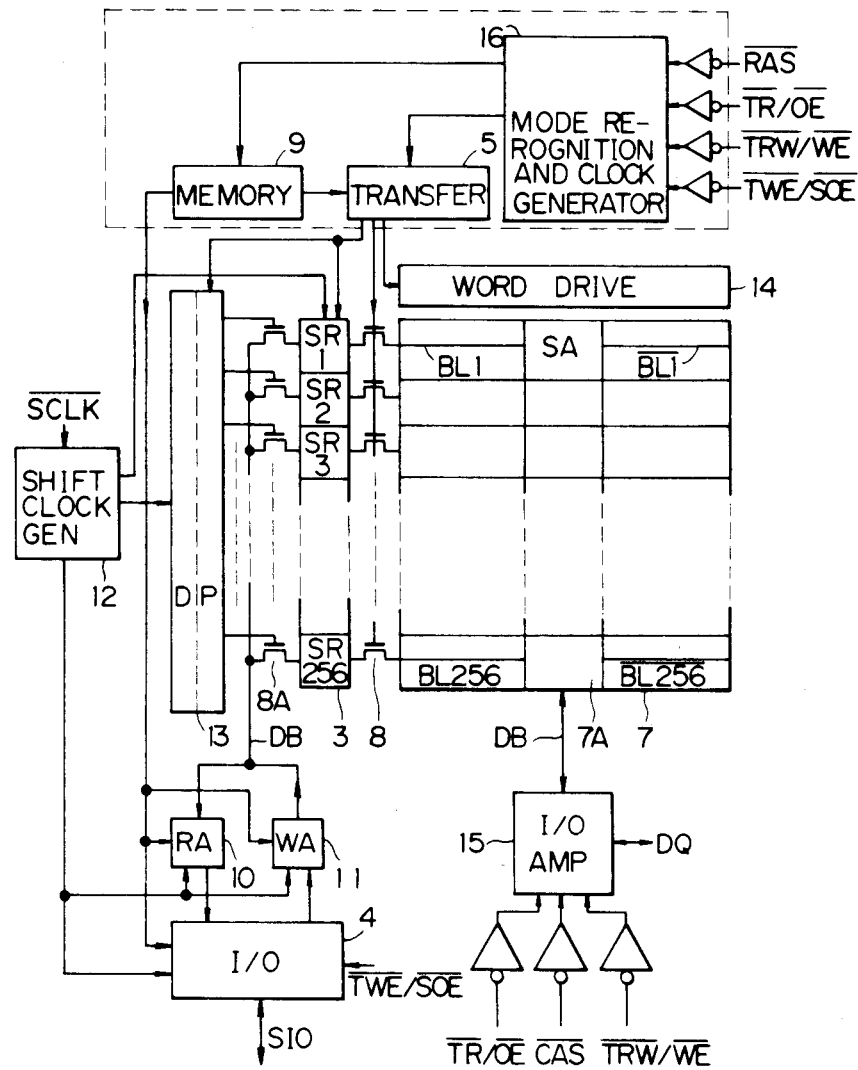
FIG. 6 is a schematic block diagram of the Video RAM according to an embodiment of the present invention.

Referring to FIG. 6, reference numeral 7 represents a memory cell array corresponding to the RAM, 7A sense amplifiers (SA) each providing bit line, 8 transfer gates, 9 a memory, 10 a read amplifier (RA), 11 a write amplifier (WA), 12 a shift clock generator, 13 a pointer (P) and decoder (D), 14 a word line drive circuit, 15 an input/output amplifier, and 16 a mode recognition and clock generator. BL1 and $\overline{BL1}$ to BL256 an $\overline{BL256}$ represent a plurality of pairs of bit lines. As shown before, reference numeral 3 represents a plurality of shift registers (SR), 4 the I/O circuit and 5 the transfer command circuit. A transfer control means is constituted by the memory 9, transfer circuit 5, and mode recognition 16. Each transfer gate 8 is provided between each bit line BL and each shift register SR, and is turned ON/OFF by the signal from the transfer gate circuit 5.

The memory 9 is provided for storing just before the transfer mode and constituted by flip-flop circuit as shown in detail hereinafter.

The shift clock circuit 12 corresponds to the clock generator 4B in FIG. 1 and is used for generating clock signal $\overline{SCLK}$. The output clock signal of this circuit 12 is input in parallel to the shift register 3, the I/O circuit 4, and the decoder D (13). The decoder D designates "H" level of the pointer P as a start point based on the input address signal. The designated pointer P outputs an "H" level signal to the transfer gate 8A and a selected transfer gate 8A is turned ON. Accordingly, read data can be read out from the shift register 3 through the transfer gate 8A and the bus line DB, while the write data can be written in the shift register 3 through the bus line DB and the transfer gate 8A. The pointer P sequentially designates the transfer gate 8A based on the clock signal and the transfer signal, the transfer gate 8A is also sequentially turned ON when the gate is high level, and can transfer the data from/to any of the shift registers 3.

In the write mode, the I/O circuit 4 is switched to the input side, the data is temporarily stored in the shift register 3 through the write amplifier (WA) 11, the bus line DB, and the transfer gate 8A. Next, the mode d signal, which indicates a write operation, is input to the transfer command circuit 5 and the transfer gate 8 is opened by an output of this command circuit 5. The data stored in the shift register can be written in parallel to the memory cell array 7.

In the read operation, the transfer gate 8 is opened by the output signal from the transfer command circuit 5. In this case, the circuit 5 outputs this signal based on the mode c signal which indicates a read operation. When the gate 8 is opened, the data for one line (page) is read out in parallel from the memory cell array 7 to the shift register 3. Next, the stored data in the shift register 3 is output from the terminal SIO through the transfer gate 8A, the bus line DB, the read amplifier 10, and the I/O circuit 4.

The operation of each circuit will be explained in detail hereinafter.

Figure 7:
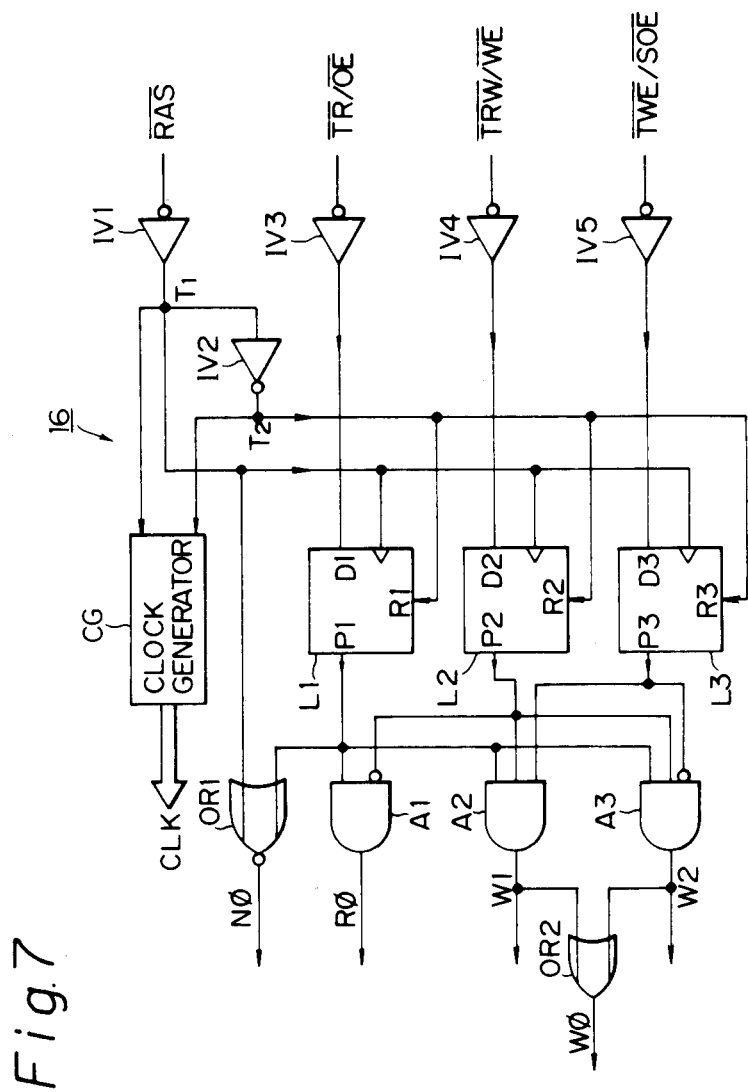
FIG. 7 is a detailed block diagram of the mode recognition logic and clock circuit shown in FIG. 6.

Referring to FIG. 7, reference letters A1 to A3 represent AND gate circuits, L1 to L3 clocked D-type latch circuits, IV1 to IV5 inverters, OR1 and OR2 OR gate circuits, and CG a clock generator. T1 represents an active pulse, T2 on reset pulse.

The output clock signal CLK from the clock generator CG is input to the transfer command circuit 5. The asynchronous signal N0, the read signal R0, and the write signals W0 to W2 are also input to the transfer command circuit 5 and the memory 9. The signal N0 is used only for the asynchronous modes a and b, in order to drive the word line. The signal R0 is used for a read transfer, and the signals W0 to W2 are used for a write transfer.

This circuit can be used for the first and second embodiments shown in FIGS. 4A to 4C and 5A to 5B.

Figure 8A:
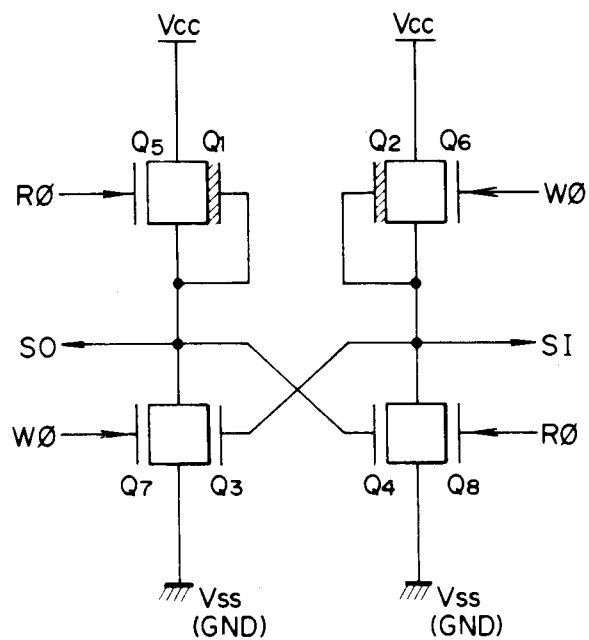
FIGS. 8A and 8B show a detailed circuit of the memory shown in FIG. 6.

Referring to FIG. 8A, this circuit is constituted by the depletion type MOS transistors Q1, Q2 and the enhancement type MOS transistors Q3 to Q8. The flip-flop circuit is constituted by the transistors Q1 to Q4, and the transistors Q5 to Q8 are used for switching the flip-flop circuit based on the write signal W0 and read signal R0. These W0 and R0 signals are input from the mode recognition circuit 16. The output mode SO (serial out) and SI (serial in) are transferred to the I/O circuit 4. This flip-flop circuit stores the direction of read/write transfer between one transfer mode and the next transfer mode.

After the read transfer, the output SO becomes high and SI becomes low based on the read signal R0. These serial output states of "H" and "L" are switched by the read signal R0 and maintained hereinafter.

While in the write transfer, the output SO becomes low and SI becomes high based on the write signal W0. These serial input states of "L" and "H" are switched by the write signal W0 and maintained hereinafter. Accordingly, this flip-flop circuit is switched, first, when the write transfer is input during the serial read state, and second, when the read transfer is input during the serial write state.

Referring to 8B, this circuit is used for detecting a first write transfer after a continuous read transfer by using a monostable multi-vibrater. The write transfer signal WT having a pulse width $t_2$ is generated by detecting the leading edge of the signal SI, because the SI is switched to "H" level when a write transfer is carried out. Accordingly, the pulse width $t_1$ of the SI is not used for generating the WT. One pulse of the signal WT is output to the transfer command circuit 5.

Figure 8B:
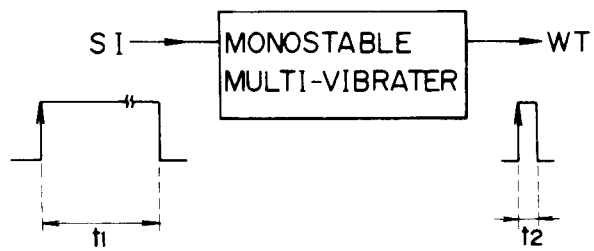

The circuit shown in FIG. 8A is used for the first and second embodiments shown in FIGS. 4A to 4C and 5A to 5B, but the circuit shown in FIG. 8B is only used for the first embodiment shown in FIGS. 4A to 4C. Accordingly, in the first embodiment, the memory circuit 9 is constituted by the flip-flop circuit and the monostable multi-vibrater.

Figure 9:
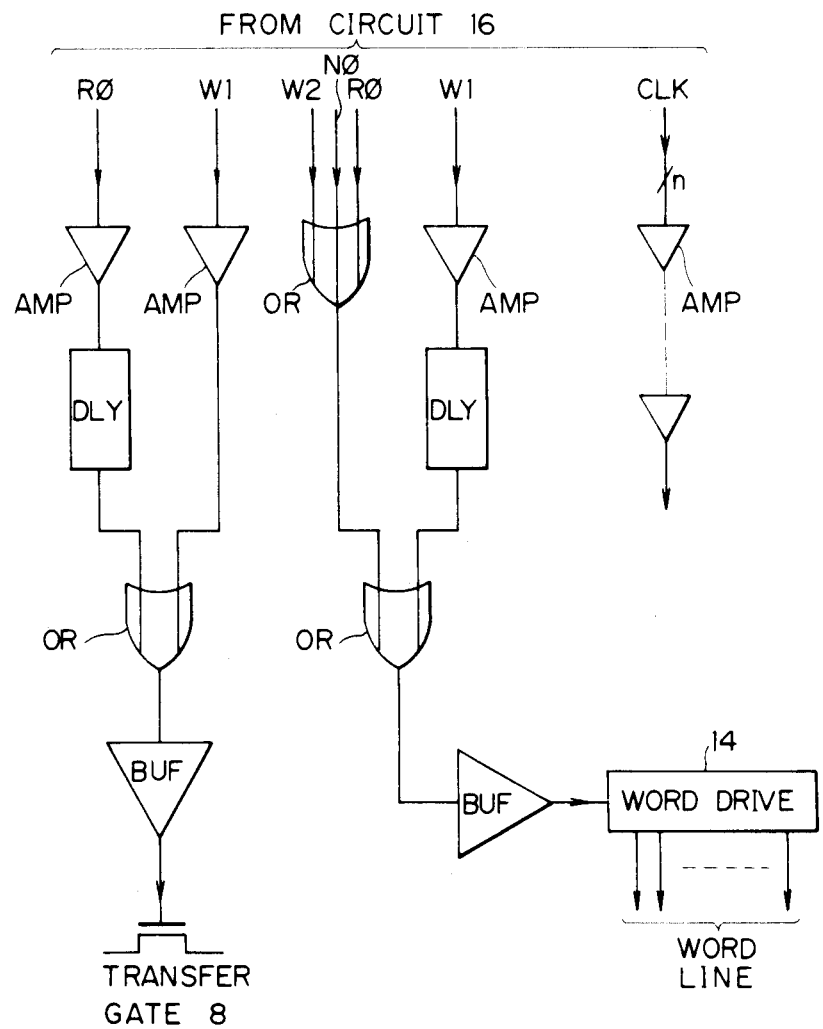
FIG. 9 is a logic diagram of the transfer command circuit shown in FIG. 6, which diagram corresponds to the second embodiment shown in FIGS. 5A to 5B.

Referring to FIG. 9, the mode can be realized by the logic diagram of input signals W1, W2, R0, and N0. In this case, the terminal $\overline{TWE/SOE}$ is set to high level in order to indicate the mode e as shown in FIG. 5B. The mode e means that the write transfer is not activated and only the terminal SIO is switched to the input side. Each delay element DLY is provided in order to invert the drive time between the word line and transfer gate in the read/write transfer. The circuit comprises an OR circuit, AMP amplifiers, and BUF buffers. This logic diagram corresponds to the second embodiment show in FIGS. 5A and 5B.

Figure 10:
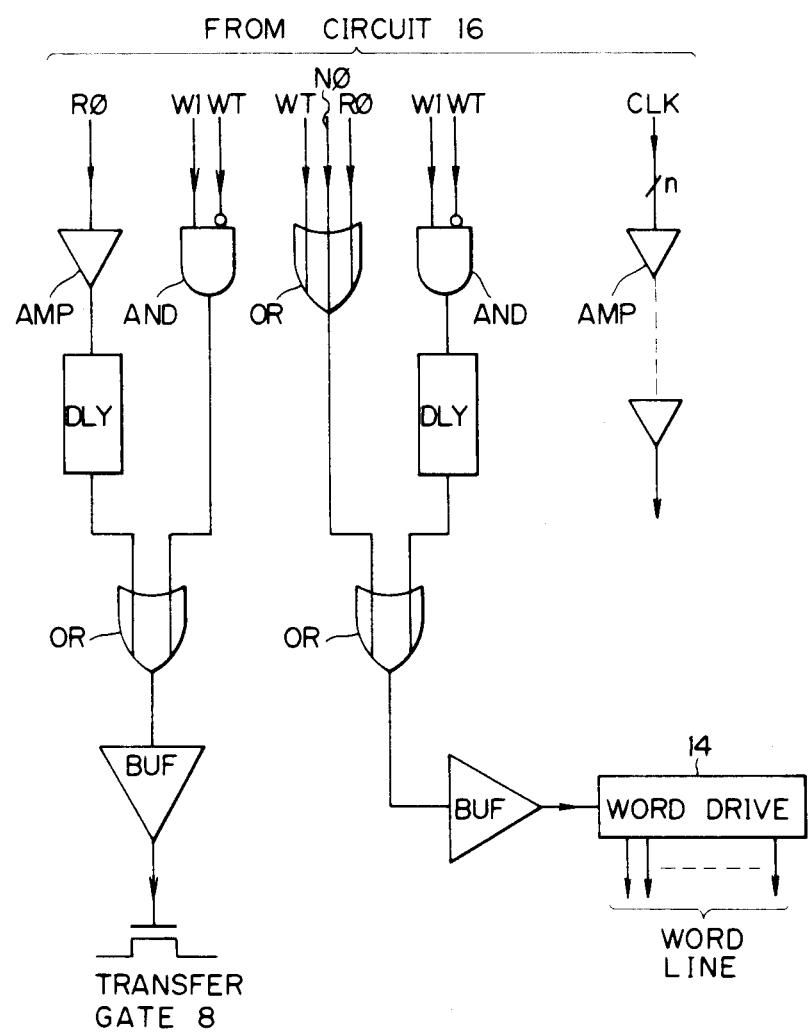
FIG. 10 is a logic diagram of the transfer command circuit shown in FIG. 6, which diagram corresponds to the first embodiment shown in FIGS. 4A to 4C.

Referring to FIG. 10, the mode can be realized by the logic diagram of input signals W1, WT, R0 and N0. In this case, since the terminal $\overline{TWE/SOE}$ is not concerned, it is necessary to detect the switch point of the SO and SI signal level. Accordingly, the signal WT is input to the AND gate, and by this signal, the first write transfer signal when the transfer mode is switched to the serial input side does not act as the transfer mode, and this transfer signal is used for switching from output to input terminal.

Referring to FIGS. 11 to 14, these signal timing charts show waveforms at each point of the circuits shown in FIGS. 7 to 10.

Figure 11:
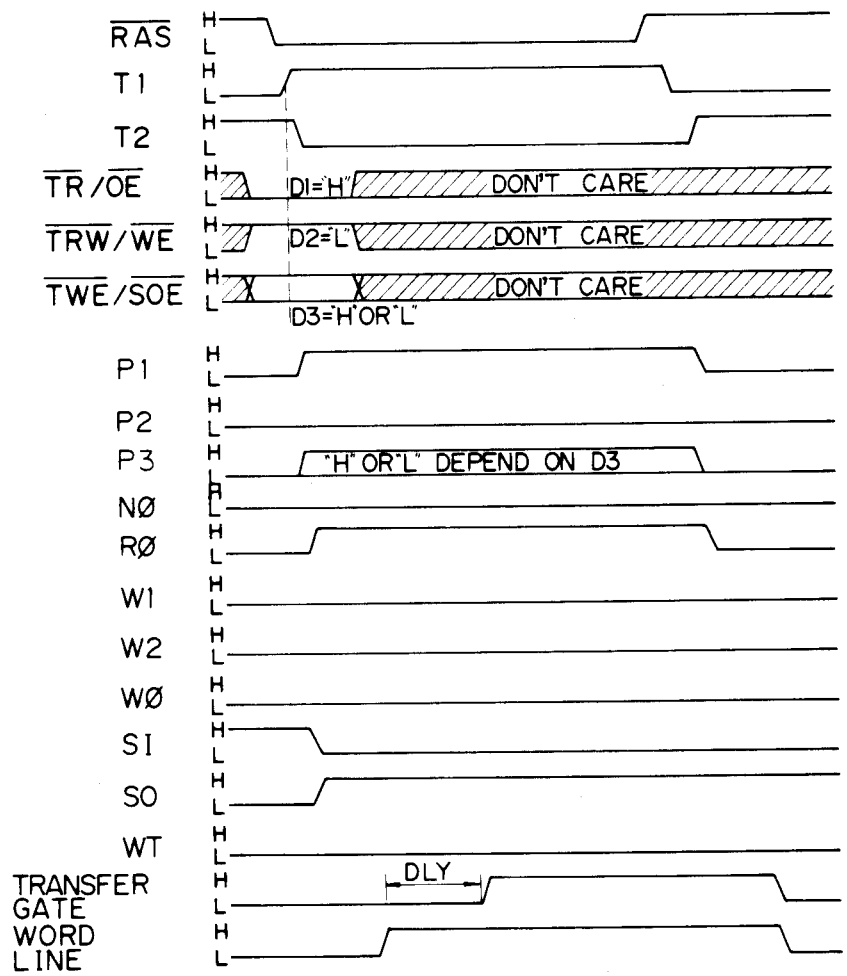
FIGS. 11 to 14 are signal timing charts corresponding to various modes.

Referring to FIG. 11, this chart shows the mode c. In this case, the mode c is used by, for example, steps of mode d→b→b→c as the first case, and mode d→c as the second case. Each case is selected by the level of the signals SI and SO. Outputs P1 to P3 of the clocked D-type latch circuits are all low level because the input data D1 to D3 are latched by the active pulse T1 and reset by the reset pulse T2. Although, in the mode b or d, the signal SI is "H" and SO is "L" level, because these modes are input, after read transfer the signal SO becomes "H" level and SI becomes "L" level based on the "H" level of the read signal R0. In this case, the I/O circuit is switches to the output side. When the selected word line is turned from "L" to "H" level, the transfer gate is opened after a short delay DLY and the data is transferred from the RAM to the shift register.

Figure 12:
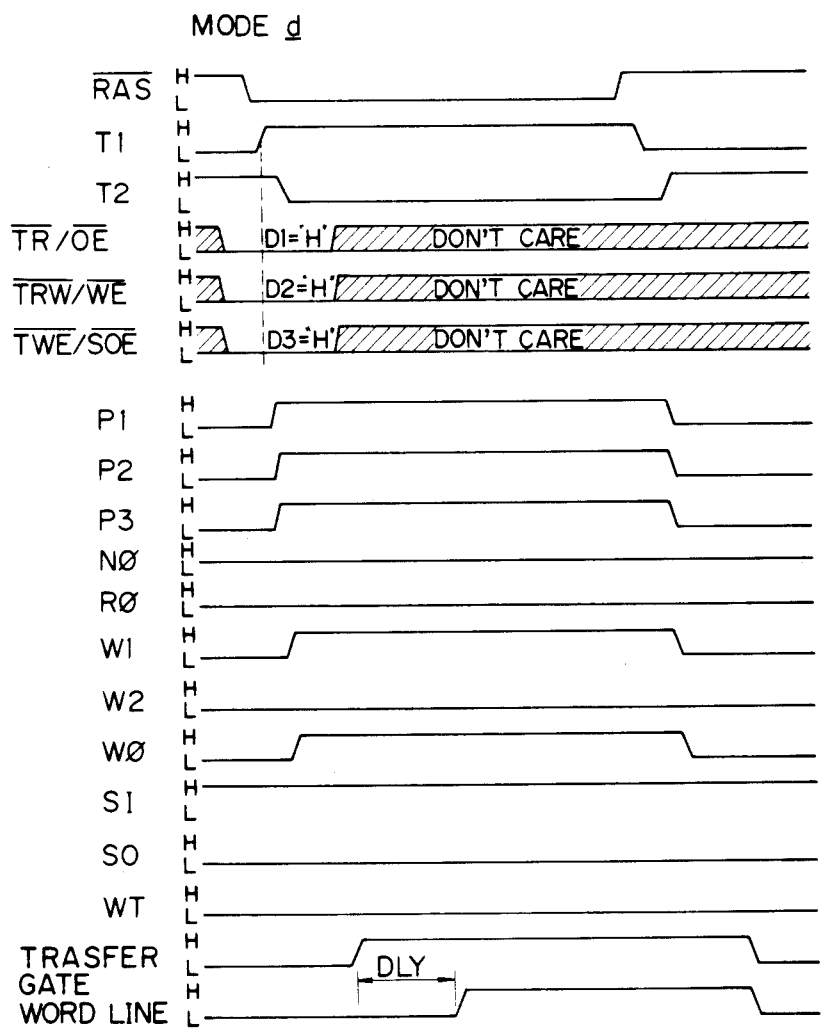

Referring to FIG. 12, this chart shows the mode d. In this case, the mode d is used by, for example, steps of mode b→b→d. The signal SI is "H" level and SO is "L" level because previous mode b is input mode. These "H" and "L" level are maintained in this mode d. When the transfer gate is turned from "L" to "H" level, the selected word line is also turned from "L" to "H" level after a short delay DLY and the data is written from the shift register in the RAM.

Figure 13:
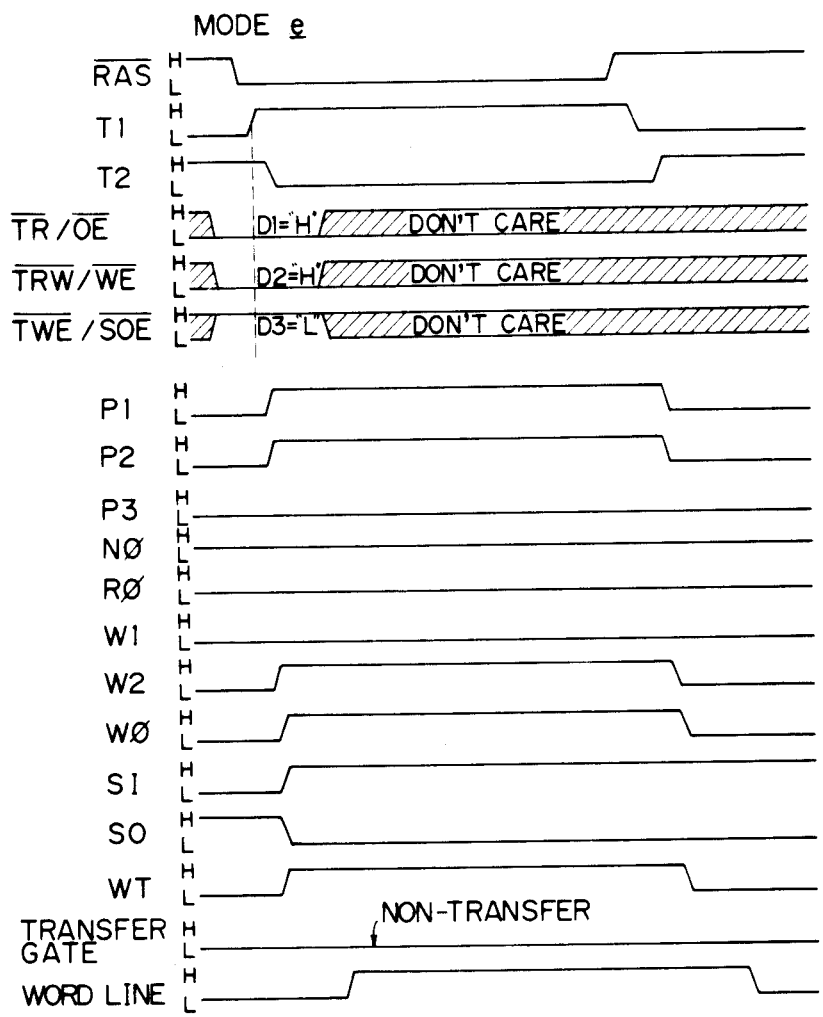

Referring to FIG. 13, this chart shows the mode e. In this case, the mode e is used by, for example, steps of mode a→a→e→b→b→d. The signal SI becomes from "L" to "H" level and SO becomes from "H" to "L" level. These "L" and "H" levels are maintained in this mode e. The I/O circuit is switched to the input side. The transfer gate is maintained to "L" level so that the data transfer is not performed in this mode, in spite of the fact that the word line is selected to the "H" level.

Figure 14:
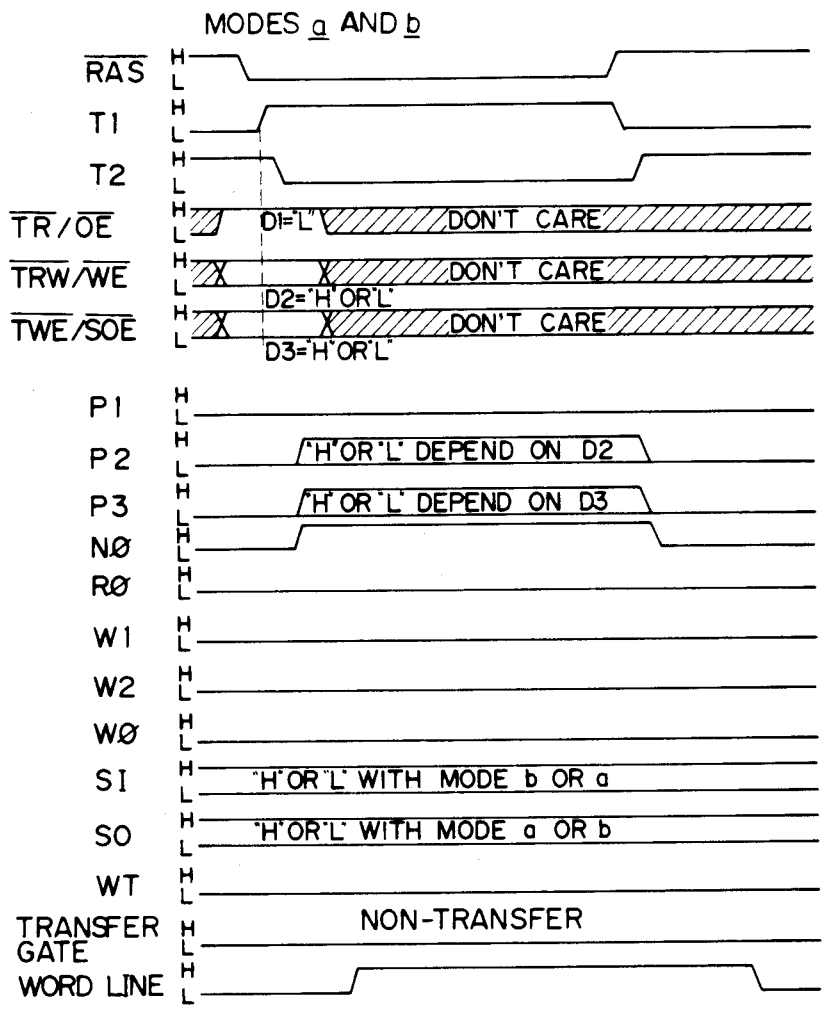

Referring to FIG. 14, this chart shows modes a and b. In the mode a, the signal SI is "L" level and the signal SO is "H" level. In this mode b, the signal SI is "H" level and the signal SO is "L" level. In this case, the transfer gate is maintained to "L" level so that the data transfer between the RAM and the shift register is not performed in these modes.

The explanation will be given of the best mode of operation for carrying out the present invention. The best mode for the present invention is employed in the Video RAM model MB81461 made by Fujitsu Limited.

This Video RAM is basically constituted by four RAM's, each of which comprises a 256×256 bits memory cell array, and four corresponding shift registers (SR) each having 256 bits.

Referring to FIG. 15, this Video RAM has 24 pins. Each of the terminals 1 to 24 has a different function, as shown in the list of FIG. 15A.

The RAM has the same functions as a dynamic RAM (DRAM) constituted by the standard type (64K×4) except for a data transfer cycle function. This RAM also comprises the functions $\overline{RAS}$ only-refresh, page-mode, and $\overline{CAS}$ before $\overline{RAS}$ refresh.

The data transfer between the RAM and the SR is performed by the $\overline{RAS}$ cycle. Whether this is a transfer cycle or normal RAM cycle is determined by the $\overline{TR/OE}$ signal in the initial cycle. The data can be transferred both ways and the direction of the data transfer is determined by the $\overline{TRW/WE}$ signal. In general, the transfer from the RAM to the SR is called a "read transfer", and the transfer from the SR to the RAM is called a "write transfer". The data transfer is always performed by every row per one cycle, as shown in FIGS. 3A and 3B. When the data transfer is run, the input/output of the SR is simultaneously switched. That is, when the rear transfer cycle is run, the I/O terminal of the SR is switched to the output mode hereinafter and the output data is obtained from the SD terminal in response to the shift clock $\overline{SCLK}$. When the write transfer cycle is run, the I/O terminal of the SR is switched to the input mode hereinafter and the input data is written from the SD terminal in response to the $\overline{SCLK}$. When the write transfer is not performed and only the I/O terminal is switched to the input mode, a dummy write transfer cycle (or, write mode enable cycle) is used instead of the write transfer cycle. The difference between these write transfer cycles lies in the level of the $\overline{TWE/SOE}$.

Each shift register SR is constituted by a data register and a pointer. The serial operation of the pointer is performed in response to the leading edge of the $\overline{SCLK}$ by adding "1" to the selected address. When the pointer reaches the final address, the pointer returns to the first address in response to the next $\overline{SCLK}$. After data transfer, the first accessed address can be optionally selected by the transfer cycle. This address is serially accessed as the first address by inputting the $\overline{SCLK}$ after data transfer. The SR can perform "real time read transfer". This transfer can be performed by synchronizing with $\overline{TR/OE}$ for a short time in the transfer cycle. That is, it is possible by serializing the data read of the SR before transfer with the data read of the SR after transfer. The input/output terminal of the SR is controlled by the $\overline{TWE/SOE}$. That is, this terminal functions as an output enable in the output mode and as a write inhibit in the input mode.

Figure 16:
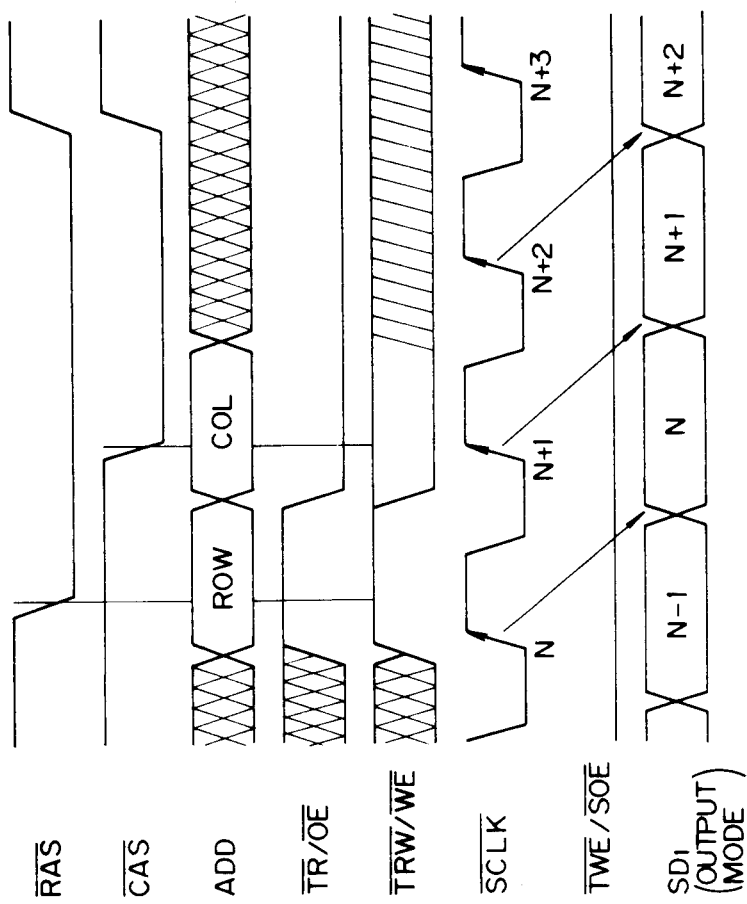
Figure 17:
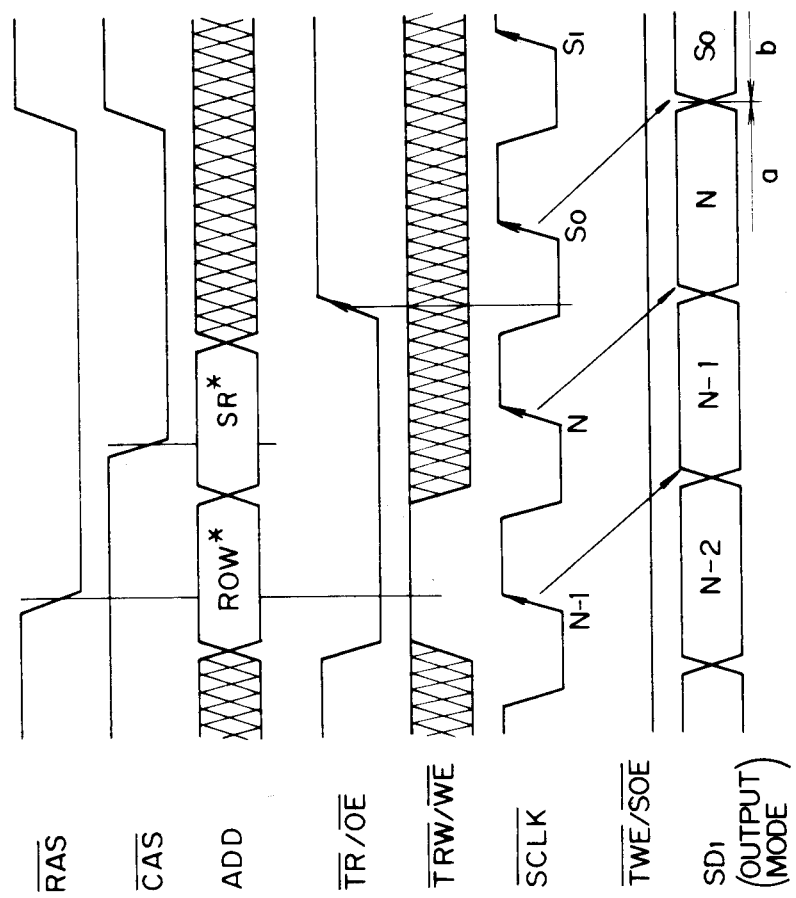

Actual timing charts of the operation of Video RAM model number MB81461 are shown in FIGS. 16 to 18. One feature of the operation is that the function decision is performed by the trailing edge of the $\overline{RAS}$. When the $\overline{TR/OE}$ is high level at this trailing edge, the data transfer is not performed, i.e., the RAM and the SR operate independently (i.e., asynchronously as shown in FIG. 4A) to one another. When the $\overline{TR/OE}$ is low level at this trailing edge, the data transfer is performed. In the transfer mode, when the $\overline{TRW/WE}$ is "H" level, it denotes a read transfer, and when the $\overline{TRW/OE}$ is of "L" level, it denotes a write transfer.

Referring to FIG. 16, this timing chart shows an independent mode of the RAM and the SR. This chart corresponds to that of FIG. 4A. The $\overline{TR/OE}$ is used as the output enable of the RAM. The SR is set to the output mode. The output data $SD_1$ can be obtained after an access time from the leading edge of the $\overline{SCLK}$ as shown by the arrow.

Referring to FIG. 17, this timing chart shows a read transfer from the RAM to the SR. This chart corresponds to that of FIG. 4B. In this case, the row address to be transferred in the RAM is designated by the portion corresponding to the row address, and the head address for reading the SR after transfer is designated by the portion corresponding to the column address. Accordingly, the asterisk mark attached to the ROW denotes the row address of the page to be transferred and the asterisk mark attached to the SR denotes the read start address of the SR after transfer. Actual transfer is performed by the leading edge as shown by arrow in the $\overline{TR/OE}$. In the $\overline{SCLK}$ applied before this leading edge, the SR data (a) just before transfer is read out, while in the $\overline{SCLK}$ applied after this leading edge, the SR data (b) just transferred is read out.

Referring to FIG. 18, this timing chart shows a write transfer from the SR to the RAM. This chart corresponds to that of FIGS. 4C and 5A, 5B. The $\overline{SCLK}$ must stop input during a low level of the $\overline{RAS}$. The $\overline{TWE/SOE}$ is low level in the trailing edge of the RAS when a write transfer is carried out. When the $\overline{TWE/SOE}$ is high level, it denotes a dummy write transfer cycle. In this case, the I/O mode of the SR is switched to the input mode and the data transfer is not performed. This mode is shown in FIG. 5B as mode e. The asterisk mark attached to the ROW and the SR have the same meanings as that of FIG. 17.

Referring to FIG. 19, this chart shows a combination of above-mentioned operation modes. $V_{CC}$ represents a power source voltage. In the transfer mode, DC represents a dummy cycle, RT a read transfer, WT a write transfer, ASYN an asynchronous operation, and DWT a dummy write transfer.

I claim:

1. A video random access memory (Video RAM) having a plurality of RAM and shift register sets, said RAM being randomly accessed and said shift register being serially accessed, each RAM and shift register being connected by transfer gates in order to transfer read/write data, said Video RAM comprising; an input/output circuit operatively connected to said shift register and switched from an input side to an output side or from an output side to an input side in response to a direction of data transfer between said RAM and said shift register, and a transfer control means for controlling said switching of said input/output circuit and for controlling said direction of data transfer based on predetermined modes of input signals.

2. A Video RAM as claimed in claim 1, wherein said transfer control means comprises a memory for storing a previous transfer state, a transfer command circuit for commanding a transfer signal to said shift register and for controlling an ON/OFF of said transfer gate, and a mode recognition and clock circuit for recognizing predetermined modes in order to control said memory and said transfer command circuit.

3. A Video RAM as claimed in claim 2, wherein said transfer recognition and clock circuit comprises three clocked D-type latch circuits for inputting four kinds of commands and one OR gate and three AND gate circuits for outputting read/write signals.

4. A Video RAM as claimed in claim 2, wherein said memory comprises a flip-flop circuit for latching a serial read/write transfer state.

5. A Video RAM as claimed in claim 2, wherein said memory further comprises a monostable multi-vibration for switching input/output mode.

6. A Video RAM as claimed in claim 2, wherein said transfer command circuit comprises a logic diagram for controlling said transfer gate, word driver, and pointer-decoder.

7. A Video RAM as claimed in claim 1, wherein said direction of data transfer is determined by four transfer modes.

8. A Video RAM as claimed in claim 7, wherein said four transfer modes comprise an asynchronous mode, read transfer mode, write transfer mode, and non-transfer mode.

9. A Video RAM as claimed in claim 7, wherein said each of said transfer modes is constituted by combining said four transfer modes.

10. A Video RAM as claimed in claim 9, wherein said each of said transfer modes is detected by a trailing edge of a row address strobe signal.

* * * * *